United States Patent [19]

Felten

[11] Patent Number: 5,032,216
[45] Date of Patent: Jul. 16, 1991

[54] NON-PHOTOGRAPHIC METHOD FOR PATTERNING ORGANIC POLYMER FILMS

[75] Inventor: John J. Felten, Newark, Del.

[73] Assignee: E. I. Du Pont de Nemours and Company, Wilmington, Del.

[21] Appl. No.: 573,075

[22] Filed: Aug. 29, 1990

Related U.S. Application Data

[63] Continuation-in-part of Ser. No. 425,387, Oct. 20, 1989, abandoned.

[51] Int. Cl.$^5$ .................... B44C 1/22; C03C 15/00; C03C 25/06; B29C 37/00
[52] U.S. Cl. .................... 156/628; 156/635; 156/655; 156/659.1; 156/668
[58] Field of Search ............ 156/628, 635, 655, 659.1, 156/668

[56] References Cited

U.S. PATENT DOCUMENTS

| | | | |
|---|---|---|---|
| 4,394,211 | 7/1983 | Uchiyama et al. | 156/628 X |
| 4,751,170 | 6/1988 | Mimura et al. | 430/296 |
| 4,808,511 | 2/1989 | Holmes | 156/628 X |
| 4,968,552 | 11/1990 | Linde | 428/195 |

FOREIGN PATENT DOCUMENTS 1431462 4/1976 United Kingdom .

Primary Examiner—William A. Powell

[57] ABSTRACT

A non-photographic method for making patterns in organic polymer films comprising the sequential steps:

a. Applying to a substrate an unpatterned first layer comprising a solid organic polymer which is dispersible in a predetermined eluant;

b. Applying to the unpatterned first layer a patterned second layer comprising an agent which is capable of changing the dispersibility of the solid organic polymer in the predetermined eluant;

c. Effecting patterned diffusion of the dispersibility-changing agent into the underlying solid organic polymer layer; and d. Removing the areas of the underlying solid organic polymer which are dispersible in the eluant by washing them with the predetermined eluant.

12 Claims, 2 Drawing Sheets

NON-PHOTOGRAPHIC METHOD FOR PATTERNING ORGANIC POLYMER FILMS

CROSS-REFERENCE TO RELATED APPLICATION

This application is a continuation-in-part of co-pending patent application Ser. No. 07/425,387 filed Oct. 20, 1989 now abandoned.

FIELD OF INVENTION

The invention is directed to a non-photographic method for patterning organic polymer films, particularly for use in the manufacture of single layer and multilayer electronic devices such as thick film hybrids.

BACKGROUND OF THE INVENTION

Thick film technology has historically been an attractive method of producing conductors, dielectrics, and resistors that are rugged and reliable. The technology is well suited for economical production of short production runs. Its ability to be patterned in multilayer configurations has allowed fabrication of devices with extremely high circuit density. The successive levels of conductors in the multilayer structure are separated by insulating dielectric layers and are interconnected by vias through the dielectric layers.

The multilayer approach is more expensive than a single layer approach because it requires painstaking inspection, realignment between layers, and careful processing to avoid blistering and cracking.

The most obvious way to reduce these problems associated with multilayer production is to reduce line and space dimensions, thereby reducing the number of layers in a given structure. The problem with this approach has been the limited resolution capability of thick film screen printing, which limits the size of vias used to connect layers of circuitry to 10 to 15 mils diameter. Likewise, conductors are limited to a narrowest line width and spacing of 5 to 7 mil lines and spaces in production quantities.

Many different approaches have been tried to obtain finer pitch lines and smaller vias. Extremely fine screen mesh and improved emulsion backing have allowed line resolution of as low as four mils line/space to be obtained in limited production. Photoformable pastes have been developed that allow five mil or finer vias, and two to three mil line/space pitch. Thick film metallizations have also been patterned with photoresists and etched to produce fine line patterns and thin film conductors have been plated up to produce fine line patterns with high conductivity.

All the above approaches have associated drawbacks. For example, fine mesh screens typically lay down thinner conductor and dielectric layers than are desirable. Photoformable pastes have a larger amount of organic matter that increases shrinkage during firing, and can produce dirty burnout that may render fired parts useless. Conductors produced with photoformable pastes have an undesirable edge curl that can reduce the reliability of circuits fabricated with them. Furthermore, all processes that require etch, photoresists, or plating, are lengthy, process sensitive, and expensive.

SUMMARY OF THE INVENTION

The invention is therefore directed to a non-photographic method for making patterns in organic polymer films comprising the sequential steps:
a. Applying to a substrate an unpatterned first layer comprising a solid organic polymer which is dispersible in a predetermined eluant;
b. Applying to the unpatterned first layer a patterned second layer comprising an agent which is capable of changing the dispersibility of the solid organic polymer in the predetermined eluant;
c. Effecting patterned diffusion of the dispersibility-changing agent into the underlying first layer; and
d. Removing the areas of the underlying first layer, which are dispersible in the eluant, by washing them with the predetermined eluant.

The invention can be used to make either negative or positive images.

In the negative-acting mode, the method comprises the sequential steps of:
a. Applying to a substrate an unpatterned first layer comprising a solid organic polymer;
b. Applying to the unpatterned first layer a patterned second layer comprising a viscous dispersion of solid organic polymer, dispersibility-changing agent and optionally solvent, the dispersibility-changing agent (1) being a dispersant for the polymer of the first organic polymer layer and (2) having a higher atmospheric boiling point than the solvent;
c. Drying the patterned second layer to remove the solvent therefrom and to effect patterned diffusion of the dispersibility-changing agent into the underlying first organic polymer layer; and
d. Removing the patterned second layer and the diffusion patterned areas of the underlying first layer by washing them in an eluant in which the second layer and diffusion-patterned areas of the first layer are dispersible.

In the positive-acting mode, the method comprises the sequential steps of:
a. Applying to a substrate an unpatterned first layer comprising a solid organic polymer which is dispersible in a predetermined solvent;
b. Applying to the unpatterned first layer a patterned second layer comprising a dispersibility-changing agent which is capable of decreasing the dispersibility of the organic polymer in the solvent;
c. Heating the patterned second layer to effect patterned diffusion of the dispersibility-changing agent into the underlying first organic polymer layer and to reduce the dispersibility of patterned areas of the polymer in the first layer in the solvent; and
d. Removing the non-patterned areas of the underlying first layer by washing them in the predetermined solvent.

BRIEF DESCRIPTION OF THE DRAWING

The drawing consists of two figures.

FIG. 1 is a schematic representation of the method of the invention in the negative-acting mode, while

DETAILED DESCRIPTION OF THE DRAWING

Figure 1:
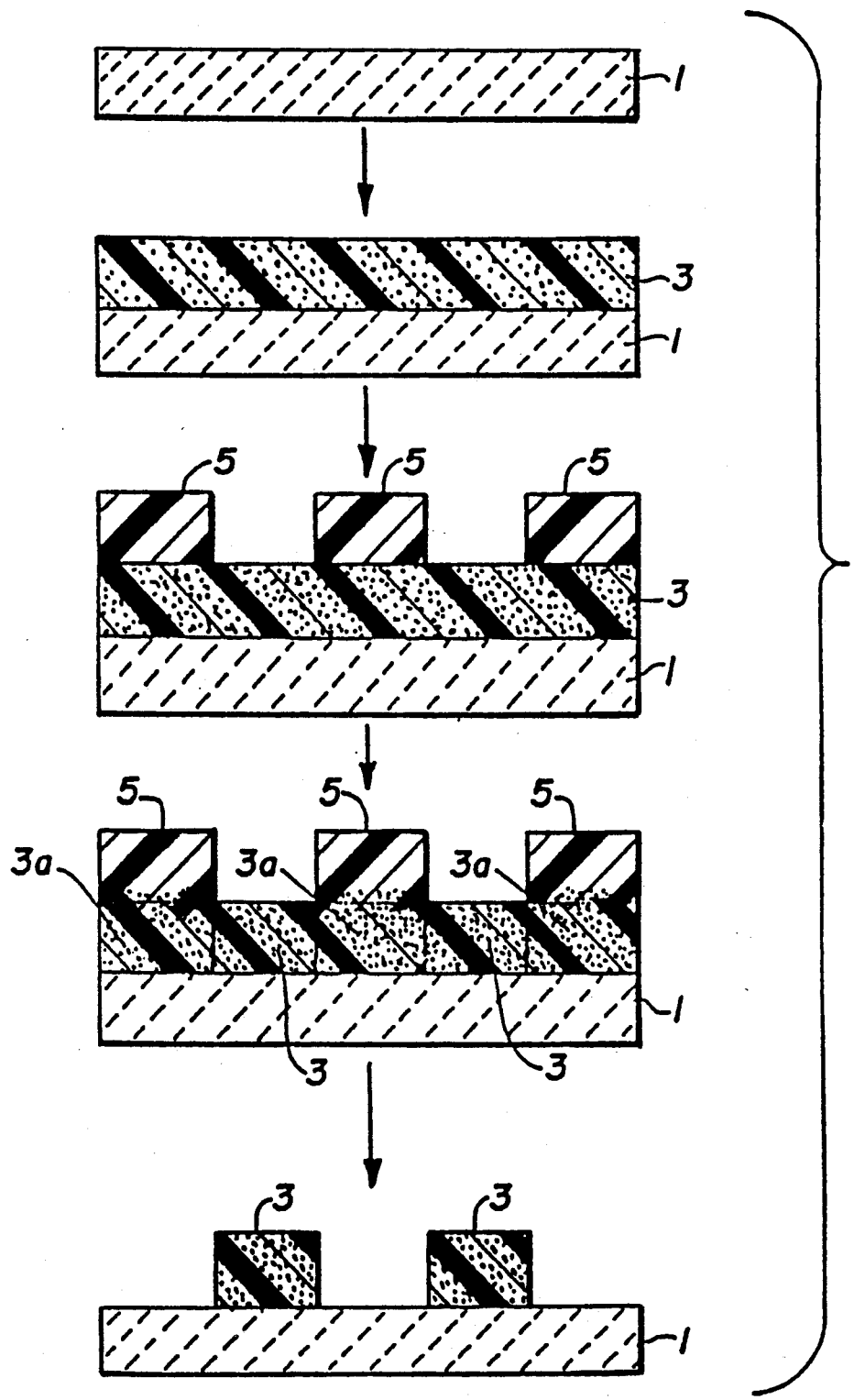

In FIG. 1 is shown schematically a negative-acting non-photographic method for making patterns in organic polymer films comprising the sequential steps:

a. Applying to substrate 1 an unpatterned first solid organic polymer layer 3;
b. Applying to the unpatterned first solid organic polymer layer 3 a patterned second layer 5 comprising a solution of solid organic polymer, solubilizing agent and solvent, the solubilizing agent (a) being soluble in the polymer of the first organic polymer layer 3 and (b) having a higher atmospheric boiling point than the solvent;
c. Heating the patterned second layer 5 to remove the solvent therefrom and to effect patterned diffusion of the solubilizing agent into the underlying first solid organic polymer layer 3a;
d. Removing the patterned second layer 5 and the diffusion patterned areas 3a of the underlying first solid organic polymer layer by washing them in a second solvent in which the solid organic polymers of second layer 5 and diffusion-patterned layers of layer 3 are soluble.

Figure 2:
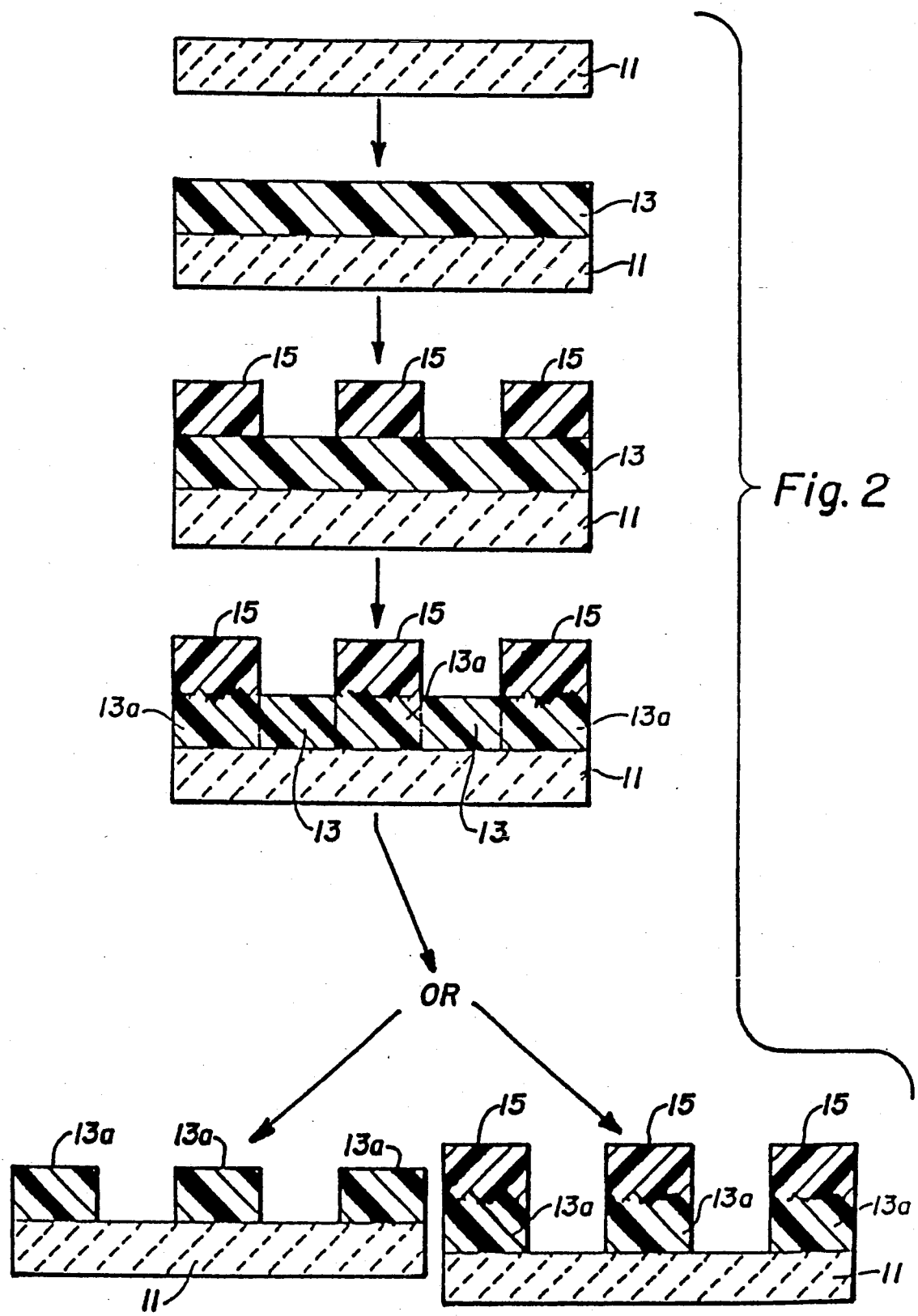
FIG. 2 is a schematic representation of the method of the invention in the positive-acting mode.

In FIG. 2 is shown schematically a positive-acting non-photographic method for making patterns in organic polymer films comprising the sequential steps:
a. Applying to a substrate 11 an unpatterned first layer 13 comprising a solid organic polymer which is soluble in a predetermined solvent;
b. Applying to the unpatterned first layer 13 a patterned second layer 15 comprising a desolubilizing agent which is capable of decreasing the solubility of the organic polymer in the solvent and is itself insoluble in the solvent;
c. Heating the patterned second layer 15 to effect patterned diffusion of the desolubilizing agent into the underlying first organic polymer layer 13 and to render the diffusion patterned areas of the polymer in the first layer 13a insoluble in the solvent; and
d. Removing the non-patterned areas of the underlying first layer 13 by washing them in the predetermined solvent.

If the insolubilizer-depleted areas of the patterned second layer 15 are soluble in the solvent, they will be removed during the solvent-washing step. On the other hand, if the insolubilizer-depleted areas of the patterned second layer 15 are insoluble in the solvent, they will remain after the solvent-washing step.

DEFINITIONS

As used herein the following terms have the indicated meanings:

The term "eluant" refers to any fluid, either liquid or gaseous, which is capable of dissolving or otherwise placing the underlying unpatterned layer into a dispersible form.

The term "dispersible" means with respect to a film of given material that the material is capable of displacement or removal by physical or chemical action of a wash liquid or by lifting off.

The term "volatile solvent" means any solvent which can be removed by evaporation at a temperature of 120° C. or less at one atmosphere.

Removal of diffusion-patterned areas of the underlying polymer layer may take place by several mechanisms such as the following:
(1) dissolving the polymer within the diffusion-patterned areas in a solvent and washing off the thusly formed polymer solution;
(2) decomposing the polymer within the diffusion-patterned areas and washing and/or evaporating off the decomposition products;
(3) emulsifying the polymer within the diffusion-patterned areas with a detergent and removing the dispersion with an aqueous wash fluid;
(4) softening the polymer within the diffusion-patterned areas to reduce its adhesion to the substrate by solvent and/or plasticizing action and lifting off the softened film from the substrate;
(5) ionizing the polymer within the diffusion-patterned areas and washing the ionized polymer from the substrate with an aqueous ionic liquid; and
(6) insolubilizing the polymer within the diffusion-patterned areas and removing the polymer film outside the diffusion-patterned areas.

DETAILED DESCRIPTION OF THE INVENTION

A. Substrate

The method of the invention can be used on either inorganic substrates, such as $Al_2O_3$, $SiO_2$, silicon, AlN and the like, or organic substrates, such as polyimides, phenoxy resins, epoxy resins and the like, or composite substrates such as filled organic polymers.

B. Organic Polymer

A wide variety of solid organic polymers can be used as the material for either or both of the polymer layers so long as they are substantially non-crystalline and possess the appropriate solubility characteristics either per se or by the addition of solubilizing or insolubilizing agents.

An essential characteristic of both polymer layers is that the polymers must be substantially non-crystalline in nature. As used herein, the term "non-crystalline polymers" therefore refers to polymers having no more than about 50% crystallinity. Such substantial non-crystallinity is essential in order to facilitate the diffusion of the solubility adjusting agent in the patterned second layer (upper polymer layer) into the lower polymer layer. Thus, among the many types of non-crystalline polymers which can be used in the method of the invention are the following:

I. By Polymerization Method
Addition polymers
Condensation polymers
II. By Physical Characteristics
Hydrolizable polymers
Crosslinkable polymers
Thermoplastic polymers
Ionizable polymers
Thermoset polymers
Elastomers
III. By Composition
Polycarbonates
Polyimides
Polyesters
Olefin copolymers
Polyacrylates (including methacrylates)
Polystyrene
Phenoxy resins
Phenol-formaldehyde resins
Cellulosic polymers
Poly (vinyl acetate)
Poly (vinyl butyral)
Poly (vinyl chloride)
Poly (vinyl chloride acetate)

C. Formulation and Application

The method of the invention is intended primarily for use on layers of small thickness such as those used in the fabrication of electronic components. Typically the second layer polymer will range from 10 to 30 microns while the first layer polymer can be of much greater thickness from, 10 to 100 microns. The thickness of the patterned layer is limited chiefly by the method of application rather than by considerations of operability.

The amount of solubilizing agent in the second layer must be sufficient to provide a solubilizing amount by diffusion to the underlying first layer. Thus, the second layer will contain at least 10% weight solubilizing agent and may contain as much as 90% weight depending upon the solubity relationships of the respective polymers.

Furthermore, in some instances, it may be desirable to add a plasticizer or other solubilizing agent to the underlying first layer in order to make the polymer more susceptible to the action of the solubilizing agent which is diffused from the second polymer layer.

By and large, the individual steps for preparation of the component layers for the method of the invention are similar to those which are known by those skilled in the art of conventional thick film, green tape and polymer technology. Thus, the following procedures may not be new by themselves, but illustrate a preferred method for formulating and preparing the materials to be used in the invention.

1. Process Paste Preparation and Dielectric Underprint a. Premilling: The dielectric's inorganic components are predispersed by roll milling them together in a ball mill, for example with an approximately equal weight of methanol or isopropanol for 30 to 90 minutes, then decanting and allowing to solids to settle out for 2 to 16 hours. The supernatant alcohol is then decanted and the solids are dried under nitrogen to reduce possibility of an explosion at room temperature; when solids are thoroughly dry they are oven dried for one hour.

b. Vehicle Preparation: Solvent, resin, antioxidant, and t-butylanthraquinone are added together in a resin kettle and heated until dissolved. Optionally, the wetting agent may also be added to the solution before paste preparation. Resin and solvent appear to function best in these pastes when they are heated together to a maximum temperature of 140 degrees, then cooled to 70 degrees for addition of ionol, t-butylanthraquinone, and, optionally, the wetting agent. The wetting agent may also be added in the paste preparation step below.

c. Paste Preparation: The paste is prepared by thoroughly mixing the predispersed solids with the vehicle and the other organic components, then roll milling until an acceptable grind gauge is obtained (about 12/8 or better). Optionally some small portion of the vehicle and/or solvent is withheld from the formulation before roll milling; a sufficient amount is then added after roll milling to achieve the desired viscosity. Thus, slightly more or less than the nominal amount of solvent or resin stated in the recipe may be in the final formulation.

The amount of plasticizer needed for optimum functioning may also vary slightly from lot to lot of paste; hence, a small amount of plasticizer may also be withheld from the formulation before roll milling. In manufacturing practice, several trial formulations are made with the main plant lot, to decide on the best formulation for that particular combination of vehicle and inorganic solids.

2. Conductor Underprint a. Vehicle Preparation: The vehicle is prepared exactly as the vehicle for the dielectric underprint.

b. Paste Preparation: The conductor inorganic components are thoroughly mixed with the vehicle described above and other organic components. The mixture is then roll milled to an acceptable grind gauge (about 15/8 or better). Some of the solvent, vehicle, and/or plasticizer may be withheld before roll milling, in order to optimize the amounts of those components later. Milling and formulation techniques are similar to those used for the dielectric.

3. Patterning Overprint

Vehicle Preparation: Vehicles are prepared by pre-dissolving the ethyl cellulose resin in a solution of plasticizer and solvent at an elevated temperature, to aid in the mixing of ingredients during paste formulation. Not all of the solvent and/or plasticizer in the final formulation are used in preparing the vehicle, since some of those components may optionally be added after roll milling, to optimize the amounts of them in the final formulation. Thus, the final formulation may not correspond exactly to the recipe given in this document. It is, however, representative of slightly varying pastes that have been prepared.

4. Paste Preparation and Printing

The patterning paste's inorganic and organic components not contained in the vehicle are thoroughly mixed with the vehicle described above. The mixture is then roll milled to an acceptable grind gauge (about 15/8 or better). Some of the solvent, vehicle, and/or plasticizer may be withheld before roll milling, in order to optimize the amounts of those components later. Milling and formulation techniques are similar to those used for the dielectric.

The dielectric pastes are typically printed twice with 200 mesh screens at one to two inches per second squeegee speed. The patterning pastes are printed over the dielectric at higher speeds, since only a small part of the screen is open mesh.

The conductor pastes are printed with a 325 or 400 mesh screen, depending on the conductor thickness and resolution desired. Patterning pastes are likewise printed with a 325 or 400 mesh screen, to optimize the amount of plasticizer delivered to the underprint. Thinner screens and fewer prints are needed than with the dielectric, because of the thinner films typically used with conductors.

5. Alternative Patterning Methods

One of the advantages of the diffusion patterning of this invention is its ability to pattern a relatively thick underprint pattern with a thin patterning coat. For example, one thickness of a patterning agent such as butyl benzyl phthalate can be used to pattern an underprint five to ten times its thickness. Thus, the method can be used to make very precise thick patterns. For example, to achieve the same thickness as the compositions in Example 1 by screen printing, about 75–175 microns (3–7 mils) of precisely registered thick film ink would have to be deposited, while keeping via openings as small as 4 mils from flowing in.

This ability to pattern a very thick layer using a relatively thin print has led to other methods of patterning that would have, for example, tremendous throughput advantages over screen printing. In addition to screen printing we have demonstrated the generation of patterns by using the materials in Example I with a flexographic patterning process, where the patterning ink is transferred from a printing plate to the dielectric underprint, then diffused and developed. The potential throughput of a flexographic application method is enormously greater than that of screen printing. Screen printing typically aperating at 4000 to 5000 square inches per hour is considered high throughput. A flexographic system, or an offset system, could produce 6,000 to 20,000 square inches per minute with better resolution, in diffusion patterning.

Other methods of applying the patterning print are the following: (1) direct writing with a pen on a plotter to produce prototype circuit boards without generating artwork or exposing boards; (2) writing with an ink jet printhead similar to those found in commercially available computer printers; and (3) using a solid state solubility altering agent such as a compatible plasticizer, resin, acid, or base that can be toned onto the underprint, e.g. by a laser printer.

In order to exploit fully the throughput advantages of the invention, it may be preferred to apply the underprint by means other than screen printing, such as in a cast tape form. Development of patterned parts may have to be a batch process to keep up with the throughput of the rest of the system; and firing may also have to become a batch process is large kilns to accommodate the production scale. Consequently, it will be recognized by those skilled in polymer technology that each polymer species is compatible with a large number of different types of plasticizers or non-volatile solvents. As a result, the number of suitable polymer/solvent/non-solvent combinations is legion. Following are examples of several commercially available polymers and the plasticizers and solvent/non-solvent systems with which they can be used in practicing the invention.

D. Polymer/Plasticizer Combinations for Diffusion Patterning

1. Cellulose Acetate

Compatible plasticizers are Triethyl Citrate, Acetyl Triethyl Citrate, epoxy type plasticizers, glycerol acetate (mono, di, tri), dimethyl adipate, tridecyl adipate, di n-hexyl azelate, ethylene glycol diacetate, diethylene glycol esters and derivatives, triethylene glycol esters (e.g. methyl, ethyl, propyl, butyl), di- and tri-propylene glycol esters. Also, long chain hydrocarbons and aromatic hydrocarbons, chlorinated paraffins supplied by Dover Chemical Co., New York, N.Y., tricresyl phosphate, alkyl phthalates (dimethyl through dibutyl), dimethyl sebacate, and sulfonic acid derivatives such as o- and p-toluenesulfonamide.

2. Cellulose Acetate Butyrate

Compatible plasticizers are citric acid esters (ethyl through butyl), acetyl epoxy stearates, glycerol di- and tri-acetate, dimethyl and dibutyl adipates, tridecyl adipate, dihexyl adipate, diethylene glycol dipelargonate, dipropylene glycol caprylates and heptanoates, hydrocarbons, sucrose acetate isobutyrate, dioctyl isophthalate, glycerol monolaurate, trioctyl trimellitate, triisodecyl trimellitate, isopropyl myristate, n-butyl myristate, butyl oleate, tetrahydrofurfuryl oleate, chlorinated paraffins and derivatives, diethylene glycol dipelargonate, alkyl phosphates (triethyl through tributyl), triphenyl phosphate, tricresyl phosphate, tri-isopropyl phenyl phosphate, tri-xylenyl phosphate, phthalic acid esters (dimethyl through dihexyl), mixed alcohol phlhalates such as butyl benzyl phthalate, butyl-ethylhexyl phthalate, dicyclohexyl phthalate, various polyesters, methyl ricinoleate, dimethyl sebacate, many stearic acid derivatives such as alkyl stearates (propyl through octyl), 1,2-propylene glycol monostearate, and dioctyl terephthalate.

3. Cellulose Nitrate

Cellulose nitrate is compatible with an unusually large number of plasticizers. Some plasticizers are: acid esters of abietic acid (methyl abietate), acetic acid esters (cumphenylacetate), adipic acid derivatives (e.g. benzyloctyl adipate, diisodecyl adipate, tridecyl adipate), azelaic acid esters such as diisooctyl azelate, diethylene glycol dibenzoate, triethylene glycol dibenzoate, citrates such as triethyl citrate, epoxy type plasticizers, polyvinyl methyl ethers, glycerol mono-, di-, and triacetates, ethylene glycol diacetate, polyethylene glycol 200 to 1000, phthalate esters (dimethyl to dibutyl), isophthalic acid esters (dimethyl, diisooctyl, di- 2-ethylhexyl), mellitates such as trioctyl trimellitate, isooctylisodecyl trimellitate, isopropyl myristate, methyl and propyl oleates, isopropyl and isooctyl palmitates, chlorinated paraffin, phosphoric acid derivatives such as triethyl phosphate, tributyl phosphate, tributoxyethyl phosphate, triphenyl phosphate, polyesters, dibutyl sebacate, dioctyl sebacate, stearates such as octyl stearate, butoxyethytl stearate, tetramethylene glycol monostearate, sucrose derivatives such as sucrose octoacetate, sulfonic acid derivatives such as benzenelsulfonmethylamide, or dioctyl terephthalate.

4. Ethyl Cellulose

Most plasticizers that are compatible with cellulose nitrate are also compatible with ethyl cellulose. Ethyl cellulose is thus compatible with a large number of plasticizers. Some plasticizers are: acid esters of abietic acid (methyl abietate), acetic acid esters (cumphenylacetate), adipic acid derivatives (eg. benzyloctyl adipate, diisodecyl adipate, tridecyl adipate), azelaic acid esters such as diisooctyl azelate, diethylene glycol dibenzoate, triethylene glycol dibenzoate, citrates such as triethyl citrate, epoxy type plasticizers, polyvinyl methyl ethers, glycerol mono-, di-, and triacetates, ethylene glycol diacetate, polyethylene glycol 200 to 1000, phthalate esters (dimethyl to dibutyl), isophthalic acid esters (dimethyl, diisooctyl, di- 2-ethylhexyl), mellitates such as trioctyl trimellitate and isooctylisodecyl trimellitate, isopropyl myristate, methyl and propyl oleates, isopropyl and isooctyl palmitates, chlorinated paraffin, phosphoric acid derivatives such as triethyl phosphate, tributyl phosphate, tributoxyethyl phosphate, triphenyl phosphate, polyesters, dibutyl sebacate, dioctyl sebacate, stearates such as octyl stearate, butoxyethyl stearate, tetramethylene glycol monostearate, sucrose derivatives such as sucrose octoacetate, sulfonic acid derivatives such as benzenesulfonmethylamide, or dioctyl terephthalate.

5. Polystyrene

Typical plasticizers are methyl abietate, hydrogenated methyl abietate, benzyl octyl adipate, many alkyl adipates (butyl through decyl and mixed esters), azelaic acid esters such as di-(2-ethylhexyl) azelate, some benzoic acid esters such as diethylene glycol dibenzoate, citric acid derivatives such as tri-n-butyl citrate, oleic acid esters such as methyl oleate, chlorinated paraffins, alkyl and aryl phosphates such as tributyl phosphate or tricresyl phosphate, many phthalate esters such as dimethyl, dipropyl, dibutyl, or dioctyl phthalate, butyl benzyl phthalate, and other mixed alkyl and aryl phthalates. Also, ricinoleic and sebacic acid esters; some stearate esters such as n-butyl stearate; poly alpha methylstyrene; and dioctyl terephthalate.

6. Poly (Vinyl Acetate)

Plasticizers are sulfonic acid derivatives such as o-and p- toluenesulfonamide; sucrose derivatives such as sucrose octoacetate; some stearates, such as glycerol triacetoxy stearate; dibenzyl sebacate; ricinoleic acid esters; polyesters; some phthalate estes such as dibutyl and butyl benzyl phthalates; most phosphoric acid esters, such as tributyl or triphenyl phosphates; most chlorinated paraffins; glyceryl monooleate; di-n-butyl maleate; some glycol derivatives such as polyethylene glycol di-(2-ethylhexoate). Also, citric acid esters such as triethyl or tri-n-butyl citrate.

7. Poly (Vinyl Butyral)

Methyl Abietate, cumphenyl acetate, dibutyl adipate, di-(2-theylhexyl) adipate; also, tridecyl adipate, diethylene glycol diadipate, polyethylene glycol (200) dibenzoate, hydrogenated terphenyl, citric acid alkyl esters such as triethyl citrate, tri-n-butyl citrate, triethyl citrate; epoxidized soy bean oil; epoxidized tallate ester; cumphenyl benzyl ether; dipropylene glycol dicaprylate; triethylene glycol tripelargonate; a few hydrocarbon type plasticizers; diisooctyl isophthalate; glycerol monolaurate; triisononyl mellitate; n-propyl oleate; glycerol mono oleate; many chlorinated paraffins; pentaerithritol tetra isopentanoateheptanoate; many phosphate esters such as the alkyl phosphates (tributyl, tri-2-ethylhexyl, triphenyl, etc.,) tris (chloropropyl) phosphate, diphenyl octyl phosphate, diphenyl-xylenyl phosphate, phenyl isopropyl phenyl phosphate. Also, many phthalate esters, such as dimethyl, diethyl, dipropyl, dibutyl, butyl benzyl, dioctyl or dicapryl phthalate; mixed phthalates; ditridecyl phthalate; also polyesters; some ricinoleic acid esters, such as methyl acetyl ricinoleate; stearic acid esters such as glyceryl tri-acetoxy stearate. Also, o- and p-toluene-ethylsulfonamide.

8. Poly (Vinyl chloride)

Methyl Abietate, cumphenyl acetate, dibutyl adipate, di-(2-theylhexyl) adipate; also, tridecyl adipate, diethylene glycol diadipate, polyethylene glycol (200) dibenzoate, hydrogenated terphenyl, citric acid alkyl esters such as triethyl citrate, tri-n-butyl citrate, triethyl citrate; epoxidized soy bean oil; epoxidized tallate ester; cumphenyl benzyl ether; dipropylene glycol dicaprylate; triethylene glycol tripelargonate; a few hydrocarbon type plasticizers; diisooctyl isophthalate; glycerol monolaurate; triisononyl mellitate; n-propyl oleate; glycerol mono oleate; many chlorinated paraffins; pentaerithritol tetra isopentanoateheptanoate; many phosphate esters such as the alkyl phosphates (tributyl, tri-2-ethylhexyl, triphenyl, etc.,) tris (chloropropyl) phosphate, diphenyl octyl phosphate, diphenyl-xylenyl phosphate, phenyl isopropyl phenyl phosphate. Also, many phthalate esters, such as dimethyl, diethyl, dipropyl, dibutyl, butyl benzyl, dioctyl or dicapryl phthalate; mixed phthalates; ditridecyl phthalate; also polyesters; some ricinoleic acid esters, such as methyl acetyl ricinoleate; stearic acid esters such as glyceryl tri-acetoxy stearate. Also, many other epoxy type plasticizers; Also suitable: polyethylene glycol di-(2-ethylhexoate); dibutyl sebacate; dioctyl- and dinonyl- sebacates; and dioctyl terephthatate.

9. Vinyl Chloride/Vinyl Acetate Copolymer

Methyl abietate, cumphenyl acetate, dibutyl adipate, di- (2-ethylhexyl) adipate; also, tridecyl adipate, diethylene glycol diadipate, polyethylene glycol (200) dibenzoate, hydrogenated terphenyl, citric acid alkyl esters such as triethyl citrate, tri-n-butyl citrate, triethyl citrate; epoxidized soy bean oil; epoxidized tallate ester; cumphenyl benzyl ether; dipropylene glycol dicaprylate; triethylene glycol tripelargonate; a few hydrocarbon type plasticizers; diisooctyl isophthalate; glycerol monolaurate; triisononyl mellitate; n-propyl oleate; glycerol mono oleate; many chlorinated paraffins; pentaerithritol tetra isopentanoateheptanoate; many phosphate esters such as the alkyl phosphates (tributyl, tri-2-ethylhexyl, triphenyl, etc.,) tris (chloropropyl) phosphate, diphenyl octyl phosphate, diphenyl-xylenyl phosphate, phenyl isopropyl phenyl phosphate. Also, many phthalate esters, such as dimethyl, diethyl, dipropyl, dibutyl, butyl benzyl, dioctyl or dicapryl phthalate; mixed phthalates; ditridecyl phthalate; also polyesters; some ricinoleic acid esters, such as methyl acetyl ricinoleate; stearic acid esters such as glyceryl tri-acetoxy stearate. Also, many other epoxy type plasticizers; Also suitable: polyethylene glycol di-(2-ethylhexoate); dibutyl sebacate; dioctyl- and dinonyl- sebacates; and dioctyl terephthatate.

10. Polymethylmethacrylate

Compatible plasticizers are: methyl abietate, camphor, cumphenyl acetate, octyl and nonyl adipates, dipropylene glycol dibenzoate, polyethylene glycol (200) dibenzoate, pentaerythritol tetrabenzoate, di- and triethylene glycol esters, some hydrocarbon type plasticizers, mellitic acid esters such as triisononyl trimellitate, isopropyl myristate, isopropyl oleate, ethylene glycol monobutyl ether oleate, chlorinated paraffins, phosphoric acid esters such as triethyl and tributyl phosphate, t-butyl diphenyl phosphate, tricresyl phosphate, alkyl aryl phosphates; many phthalic acid esters such as dibutyl, dipropyl, or dihexyl phthalate; also butyl benzyl phthalate; dioctyl phthalate; didecyl phthalate, or docyclohexyl phthalate. Also, dibutyl or dioctyl sebacate; other sebacic acid esters; sucrose benzoate; and terephthalic acid esters such as dioctyl terephthalate. Camphor is also a useful plasticizer.

E. Solvent/Non-solvent Systems for Diffusion Patterning

1. Cellulose Acetate

Solvents: Methylene chloride/methanol, chloroform/methanol, benzyl alcohol, phenols, ethylene glycol ethers, dioxane, diethanolamine, pyridine, aniline, acetone, cyclohexanone, formic acid, acetic acid, methyl acetate, ethyl acetate/nitrobenzene, glycol monoethyl ether acetate, nitromethane.

Non-Solvents: Hydrocarbons, aliphatic ethers, weak mineral acids.

2. Cellulose Acetate Butyrate

Solvents: Benzene, toluene (hot), chloroform, carbon tetrachloride, tetrachloroethane, methanol (hot), acetone, cyclohexanone, dioxane, aliphatic esters, nitroethane.
Non-Solvents: Aliphatic hydrocarbons, methanol (cold), ethanol, diethyl ether.

3. Cellulose Nitrate

Solvents: (N denotes nitrogen content.) N>10,5,>12%: Alcohol (lower), alcohol/diethyl ether, acetone, amyl acetate, ethylene glycol ethers, acetic acid (glacial). N>=12%: Halogenated hydrocarbons, ethanol/diethyl ether, acetone, methyl amyl ketone, cyclohexanone, methyl acetate, ethyl acetate, ethyl butyrate, ethyl lactate, ethylene glycol ether acetates, ethylene carbonate, furan derivatives, nitrobenzene.
Non-Solvents: N>10.5 and <12%: Higher alcohols, higher carboxylic acids, higher ketones, tricresyl phosphate: N>12%: Aliphatic hydrocarbons, aromatic hydrocarbons, lower alcohols, higher alcohols (sw), ethylene glycol, diethyl ether, dilute carboxylic acids, water.

4. Ethyl Cellulose

Solvents: (D.S. denotes degree of substitution with ethoxyl groups.) D.S.=1.0 to 1.5: Pyridine, formic acid, acetic acid, water (cold) D.S.=2 Methylene chloride, chloroform, dichloroethylene, chlorohydrins, ethanol, THF. D.S.=2.3 Benzene, toluene, alkyl halogenides, alcohols, furan derivatives, ketones, acetic esters, carbon disulfide, nitromethane. D.S.=3.0 Benzene, toluene, methylene chloride, alcohols, esters.
Non-Solvents: D.S.=1.0 to 1.5: Ethanol. D.S.=2.0 Hydrocarbons, carbon tetrachloride, trichloroethylene, alcohols, diethyl ether, ketones, esters, water. D.S.=2.3 Ethylene glycol, acetone (cold). D.S.=3.0 Hydrocarbons, decalin, xylene, carbon tetrachloride, tetrahydrofurfuryl alcohol, diols, n-propyl ether.

5. Polystyrene

Solvents: Cyclohexane (>35 deg. C.), cyclohexane/acetone, methylcyclohexane/acetone, decahydronaphthalene/diethyl oxalate, benzene, toluene, ethylbenzene, styrene, lower chlorinated aliphatic hydrocarbons, phenol/acetone, THF, dimethyltetrahydrofuran, dioxane, methyl ethyl ketone, diisopropyl ketone, cyclohexanone, glycol formal, ethyl acetate, butyl acetate, methyl-, ethyl-, n-butyl phthalate, 1-nitropropane, carbon disulfide, tributyl phosphate, phosphorus trichloride.
Non-Solvents: Saturated hydrocarbons, alcohols, phenol, diols, ethylene chlorohydrin, perfluorobenzene, 1,2,3,4-tetrafluorobenzene (lower than 10 deg. C.), diethyl ether, glycol ethers, acetone, acetic acid, isobutyl phthalate, methylhexyl phthalate, tri(chloroethyl) phosphate, tricresyl phosphate.

6. Poly (Vinyl Acetate)

Solvents: Benzene, toluene, chloroform, carbon tetrachloride/ethanol, dichloroethylene, ethanol (20:80), chlorobenzene, methanol, ethanol/water, n-butanol/water, allyl alcohol, 2,4-dimethyl-3-pentanol, benzyl alcohol, tetrahydrofurfuryl alcohol, THF, dimethyltetrahydrofuran, dioxane, glycol ethers, glycol ether esters, acetone, methyl ethyl ketone, acetic acid, lower aliphatic esters, vinyl acetate, acetals, acetonitrile, nitromethane, DMF, DMSO, chloroform, chelrobenzene.
Non-Solvents: (sw denotes swelling.) Saturated hydrocarbons, xylene(sw), mesitylene, carbon tetrachloride (sw), ethanol (anhydrous, sw), anhydrous alcohols C>1, ethylene glycol, cyclohexanol, methylcyclohexanol, diethyl ether (anhydrous, alcohol free), higher esters C>5, carbon disulfide, water (sw), dilute acids, dilute alkalies.

7. Poly (Vinyl Butyral)

Solvents: Acetalization 70%: Alcohols, cyclohexanone, ethyl lactate, ethylene glycol acetate. Acetalization 77%: Methylene chloride, alcohols, acetone, methyl ethyl ketone, cyclohexanone, lower esters, methylene chloride, alcohols, ketones, lower esters. Acetalization 83%: Methylene chloride, alcohols, ketones, lower esters.
Non-Solvents: Acetalization 70%: Aliphatic, cycloaliphatic and aromatic hydrocarbons (sw), methylene chloride, aliphatic ketones, most esters, watrer. Acetalization 77%: Aliphatic, cycloaliphatic and aromatic hydrocarbons (sw), methyl isobutyl ketone, higher esters. Acetalization 83% Aliphatic, cycloaliphatic and aromatic hydrocarbons (sw), methanol, higher esters.

8. Poly (Vinyl Chloride)

Solvents: High M.W.: THF, acetone/carbon disulfide, methyl ethyl ketone, cyclopentanone, cyclohexanone, DMF, nitrobenzene, DMSO. Lower M.W. Toluene, xylene, methylene chloride, ethylene chloride, perchloroethylene/acetone, 1,2-dichlorobenzene, dioxane, acetone/carbon disulfide, cyclopentanone, cyclohexanone, diisopropyl ketone, mesityl oxide, isophorone, DMF, nitrobenzene, HMPT, tricresyl phosphate. Chlorinated, 63% Cl: Aromatic hydrocarbons, chloroform, chlorobenzene, THF, dioxane, acetone, cyclohexanone, butyl acetate, nitrobenzene, DMF, DMSO.
Non-Solvents: All M.W.'s: Aliphatic hydrocarbons, mineral oils, aromatic hydrocarbons (sw), vinyl chloride, alcohols, glycols, aniline (sw), acetone (sw), carboxylic acids, acetic anhydride (sw), esters, nitroparaffins (sw), carbon disulfide, non-oxidizing acids, alkalies. Chlorinated, 63%: Aliphatic and cycloaliphatic hydrocarbons, carbon tetrachloride, methyl acetate, nitromethane, organic and inorganic acids.

9. Vinyl Chloride/Vinyl Acetate Copolymer

Solvents: Chloroform, chlorobenzene, pyridine, dioxane, cyclohexanone, ethyl acetate.
Non-Solvents: Benzene, Alcohols, diethyl ether, water.

10. Polymethylmethacrylate

Solvents: Dimethyl formamide, methylene chloride, chloroform, ethylene dichloride, trichloroethylene, chlorobenzene, methyl formate, ethyl acetate, isopropyl acetate, n-butyl acetate, butyl lactate, cellosolve acetate, 1,4-dioxane, tetrahydrofuran, benzene, acetone, methyl ethyl ketone, acetonitrile, nitromethane, nitroethane, 2-nitropropane, toluene, diacetone alcohol.
Non-Solvents: Methyl, ethyl, propyl, amyl alcohols; cyclohexanol; ethylene glycol; glycerol. Also formamide, carbon tetrachloride; diethyl and diisopropyl ether; FREON ® MF and TF; hexane, cyclohexane, mineral spirits, turpentine; diisobutyl ketone; cyclohexanone; isophorone; castor and linseed oils; trichloroethane.

EXAMPLES

Example 1

Two pastes were formulated: one a dielectric paste, and one a patterning paste as follows:

| Dielectric Paste | |
|---|---|
| Glass A | 15.78 grams |
| Glass B | 0.83 |
| Alumina A | 7.89 |
| Alumina B | 3.24 |
| Cobalt Aluminate | 0.08 |
| Polymethyl methacrylate | 5.36 |
| Wetting Agent | 1.25 |
| t-butylanthraquinone | 0.50 |
| Shell Ionol ® | 0.03 |
| Butyl Carbitol ®, Acetate | 14.10 |
| Butyl Benzyl Phthalate | 0.75 |

| Glass A | |
|---|---|
| $SiO_2$ | 56.2% wt. |
| PbO | 18.0 |
| $Al_2O_3$ | 8.6 |
| CaO | 7.4 |
| $B_2O_3$ | 4.5 |
| $Na_2O$ | 2.7 |
| $K_2O$ | 1.6 |
| MgO | 0.8 |
| $ZrO_2$ | 0.2 |

Glass A has a $D_{50}$ of ~4 to 4.5 microns; it is milled and classified to remove coarse and fine fractions. Its $D_{10}$ is about 1.6 microns; its $D_{90}$ is 10-12 microns. surface area is 1.5 to 1.8 $m^2/g$.

Glass B is a barium borosilicate glass used to lower the sintering temperature of the dielectric composite, due to the large particle size of glass A. Its formula follows:

| | |
|---|---|
| BaO | 37.5% wt. |
| $B_2O_3$ | 38.3 |
| $SiO_2$ | 16.5 |
| MgO | 4.3 |
| $ZrO_2$ | 3.0 |

Alumina A is a 1 micron powder with a narrow particle size distribution: $D_{10}$, $D_{50}$, and $D_{90}$ are, respectively, ~0.5, 1.1, and 2.7 microns. It is classified by settling to remove coarses and fines. Surface area is about 2.7-2.8 $m^2/g$.

Alumina B is a 0.4 micron average particle size powder with surface area of about 5 $m^2/g$.

| Patterning Paste | |
|---|---|
| Alumina A | 60.0 grams |
| Hydrogenated Castor Oil | 1.4 |
| Mineral Spirits | 4.0 |
| Colorant | 2.2 |
| Ethyl Cellulose T-200 | 4.3 |
| Terpineol | 11.9 |
| Butyl Benzyl Phthalate | 16.2 |

The above paste compositions were prepared in the manner familiar to those skilled in formulation of thick film materials and were prepared for printing as follows:

The materials were processed by printing the dielectric optionally one, two, or three prints, with each print followed by drying 10 to 15 minutes at 80 to 90 degrees Celsius. The patterning layer was then printed by using a via fill screen with several sized of via openings. The patterning paste was then dried at 80 to 100 degrees C. for 5 to 10 minutes.

The pattern was then generated in the dielectric by immersing the overprinted layers in 1.1.1-trichloroethane with ultrasonic agitation until the overprinted areas were removed and the areas under the overprinted patterning paste were dissolved away.

Vias as small as 5-7 mils were resolved in dielectric films as thick as 85 microns, with good edge definition. This is far superior both in resolution and in thickness achievable with a single patterning step with screen printing.

Example 2

Adjustment of Plasticizer level in DP Compositions

In order to be able to pattern thicker layers, it is often advantageous to add plasticizer to the bottom layer that is to be patterned. A convenient way to determine the optimum level is to make a concentration ladder using plasticizer at different concentrations in the composition to be patterned.

A dielectric paste was formulated in the manner of Example 1, but without the plasticizer. A ladder of plasticizer levels was then run to optimize the formulation. Results were as follows:

| Plasticizer Level | Quality of 4 mil Vias at Indicated Development Time (seconds) | | | | | |
|---|---|---|---|---|---|---|
| | 10 | 15 | 22 | 30 | 45 | 60 |
| None | Closed | Closed | Closed | Closed | Closed | Closed |
| 1.5% | Closed | Closed | Part Open | Part Open | Part Open | Part Open |
| 2.4% | Closed | Closed | Closed | Part Open | Part Open | Fully Open |
| 3.25% | Closed | Open | Best Quality | Erodes Surface | | |

The paste was printed and processed as in Example 1, to determine the best operating region. The best region is seen to be between 2.5 and 3.5%. Inside that formulating region, a 40-50 micron thick film is seen to be satisfactorily processable. A relatively high plasticizer level in the operable region lowers development time, and increases throughput.

Example 3

A conductor paste was formulated with copper, as follows:

| | |
|---|---|
| Copper powder, 3-4 micron | 75.0 grams |
| Glass Powder C | 5.0 |
| Poly methyl methacrylate Elvacite ® 2010 | 6.1 |
| t-butylanthraquinone | 0.6 |
| Shell Ionol ® | 0.1 |
| Butyl Carbitol ® Acetate | 13.2 |

| Glass Powder C | |
|---|---|
| $Bi_2O_3$ | 82.0% wt. |
| PbO | 11.0 |
| $B_2O_3$ | 3.5 |

-continued

| Glass Powder C | |
|---|---|
| SiO$_2$ | 3.5 |

The copper paste was prepared from the above ingredients by techniques familiar to those skilled in thick film paste formulation, and prepared for printing.

One coat of the conductor composition was printed onto alumina substrates through a 325 mesh screen and a negative of a screen printed conductor pattern was printed on top of the copper print, using the Patterning paste in Example 1. Both prints were dried at 85–95 degrees C. Dried parts were then immersed in chlorothene with ultrasound agitation for 15–25 seconds to generate the desired pattern. Parts were then fired. Precise four mil line/space patterns were generated. Fired parts were 10–12 microns thick, with a resistivity of about 3 milliohms/square. Four mil lines/space resolution is difficult, if not impossible, to achieve, in a pattern with 3 milliohms/square. In addition, the topography of the 4 mil lines is superior to screen printed parts, with more precise edge definition, and flat surfaces on the tops of conductor fingers. Three mil lines were resolved when the underprint was applied through a 400 mesh screen yielding a somewhat thinner undercoat.

Example 4

This is a gold conductor composition with similar conductivity and thickness to the copper conductor above.

| Gold Powder | 75.0 grams |
|---|---|
| Copper Bismuthate | 1.5 |
| Polymethylmethacrylate | 3.1 |
| t-butylanthraquinone | 0.3 |
| Butyl Carbitol ® Acetate | 7.2 |
| Shell Ionol ® | 0.05 |

The above formulation was prepared in the usual manner known to a person skilled in thick film formulation. The gold composition was printed with a single coat through a 32 mesh screen over an alumina substrate, and dried at 85–95 degrees. The patterning paste was then overprinted with a negative of a thick film conductor pattern, and dried again at 85–95 degrees C.

Example 5

A positive working conductor paste system was formulated in copper, as follows:

| Copper Positive Working Underprint Paste | |
|---|---|
| Copper Powder, 3–4 micron | 42.5 grams |
| Glass Powder C | 1.0 |
| Carboset ® XPD-1234 Resin | 1.6 |
| Benzotriazole | 0.15 |
| Butyl Carbitol ® Acetate | 3.75 |

| Glass Powder C | |
|---|---|
| Bi$_2$O$_3$ | 82.0% |
| PbO | 11.0 |
| B$_2$O$_3$ | 3.5 |

| Glass Powder C | |
|---|---|
| SiO$_2$ | 3.5 |

| Copper Positive Working Patterning Paste | |
|---|---|
| Copper Powder, 3–4 micron | 46.00 grams |
| Glass Powder C | 1.25 |
| Ethyl Cellulose T-50 | 0.75 |
| Santicizer ® S-160 | 2.83 |
| Terpineol Isomers | 2.29 |

The copper pastes were prepared from the above ingredients by techniques familiar to those skilled in thick film paste formulation, and prepared for printing.

One coat of the conductor composition was printed onto alumina substrates through a 325 mesh screen; a negative of a screen printed conductor pattern was then printed on top of the copper print, using the Patterning paste in this Example. Both prints were dried at 85–95 degrees C. Dried parts were then immersed in a 1% potassium carbonate aqueous solution with ultrasound agitation for 5–15 seconds to generate the desired pattern. Precise four mil line/space patterns were generated. Dried parts were 49 microns thick. In addition, the 4 mil lines had more precise edge definition than screen-printed parts.

Example 6

Diffusion Patterning by Flexographic Printing

A clearly resolved printing pattern on a flexographic printing plate was transferred to a DP dielectric formulation as follows.

A thin film of butyl benzyl phthalate plasticizer was spread onto a flexographic printing plate that had been imaged with a test pattern. The plate was then rolled over the surface of a ceramic part coated with a dried dielectric composition (See Example 1). The plasticizer that was transferred from the plate to the dielectric was then diffused into the dielectric by drying for 5 minutes in an oven at 95 degrees C. The image in the dielectric was developed by immersion in an ultrasonic bath containing 1.1.1-trichloroethane Chlorothene. The pattern from the plate could clearly be seen in the dielectric, thus demonstrating the capability of other techniques of plasticizer deposition to produce diffusion-patterned images.

Other techniques of image production could also be used such as printing with an ink jet laser printer or depositing the pattern by means of a pen on a plotter. Rotogravure or offset printing techniques can also be used.

Alternative Material Systems

There are many ways to use the selective solubilization principle to generate thick film patterns. The pattern may be positive or negative working—i.e. the area under the overprint may either be solubilized, as in Examples 1–4 or it may be insolubilized, for example by overprinting an aqueously developable polymer with a water incompatible plasticizer to protect the areas underneath, then removing the unplasticized material by aqueous solubilization.

The following Table illustrates a number of acrylic polymer/plasticizer/solvent systems which have been demonstrated for use in the method of the invention.

TABLE 2

Alternative Acrylic Material Systems

| Underprint Resin | Overprint Solubilizer (Negative) | Overprint Desolubilizer (Positive) | Patterning Solvent |
|---|---|---|---|
| Polymethylmethacrylate Phthalate | | | Dibutyl |
| Polymethylacrylate | Methyl Chloroform Butyl Benzyl-Phthalate Ethylhydroxy-ethyl cellulose | | |
| | | Polymethyl methacrylate | Ethanol/water/ ammonia |
| Carboset ® XPD-1234 | Triethanol-amine | | Water |
| | | Dibutyl Phthalate | $K_2CO_3$/Water |

The above resins may be combined. For example, methyl and ethyl methacrylate may be combined to allow positive or negative working resists. In the case of methyl methacrylate/ethyl methacrylate combinations, plasticizers such as triethylene glycol would produce a negative working resist in ethanol pattern generating solvent.

Other resin systems that are not excessively cross-linked, such as polyesters, may be patterned in a similar manner: One merely needs to determine a solubilizer or desolubilizer and a suitable pattern generating solvent.

If no solubility envelope exists for a highly cross-linked polymer, that polymer would not be a likely candidate for the process.

Epoxy Resins

A positive-working diffusion patterning system with epoxy resins can be devised as follows: A prepolymer is formed, for example, by condensation polymerising the sodium salt of bisphenol A with epichlorohydrin, as the resin in the screen printed underprinted coat to be patterned. The degree of polymerization of the prepolymer should be about 12 units long.

The crosslinking amine or polybasic anhydride such as diethylenetriamine or ethylenediamine, or succinic acid diahnydride, is added to the overprint paste. The overprint paste is then printed onto the underprint. The composite is then cured; the areas under the overprinted amine containing paste are crosslinked, insolubilizing them, and allowing the remaining material to be washed away in a suitable solvent such as trichloroethane.

Polyimides

A negative-working polyimide diffusion patterning system can be prepared by using an incompletely cured system containing, for example, pyromellitic dianhydride (PMDA) and oxydianiline (ODA). The incompletely cured polymer is used as the underprint; a paste containing a base such as triethanolamine or, particulate potassium carbonate, is overprinted as the patterning print. The material is then washed in water or weak base to remove areas under the overprint.

Other promising materials are benzophenone tetracarboxylic dianhydride reacted with hydroxyethyl-methacrylate: also suitable are the biphenyldianhydride/paraphenylenediamine system which is commercially available. In their uncured states they are susceptible to negative working development.

Example 7

Diffusion Patterning by Catalytic Decomposition

A first dielectric thick-film paste was formulated using polymethyl methacrylate as the binder component of the organic medium and an overlying thick film paste containing ethyl cellulose as the binder component and a small amount of platinum acetylacetonate to serve as a decomposition catalyst. The first paste was printed through an 80 mesh screen onto several alumina substrates to form 22 μm thick films (after firing) and the second paste was printed onto the first paste with a test screen having vias patterns ranging from 5 to 30 mils. The printed layer assemblages were then heated to various temperatures ranging from 240° to 360° C. for 20 minutes and cooled, after which each was washed with an aqueous spray. Seven mil vias were resolved. It was observed that heating within the range of 280° to 320° C. produced the most uniform vias without erosion of the film surface. The composition of the pastes was as follows:

TABLE 3

Example 7 Paste Compositions

| Dielectric Paste | Overprint Paste |
|---|---|
| Calcium zinc silicate glass 52.4 g | Alumina 60 g |
| Calcium zirconate 2.8 | Hydrocarbon solvent 2.1 |
| Blue pigment 0.3 | Dibutyl Carbitol ® 2.1 |
| Butyl benzal phthalate 4.7 | Hydrogenated Castor Oil 1.3 |
| Wetting agent 1.25 | Black pigment 2.1 |
| Anthraquinone 1.0 | Butyl benzyl phthalate 19.7 |
| Butylhydroxytoluene 0.1 | Terpineol isomers 9.7 |
| Polymetnyl methacrylate 13.6 | Ethyl cellulose 3.25 |
| Butyl Cabitol ® Acetate 25.0 | Pt acetylacetonate 2.0 |

Examples 8 and 9

Aqueous Diffusion Patterning

A calcium zinc silicate glass was formulated with a cellulosic vehicle and 3% butyl benzyl phthlate. A film of each paste was screen printed onto an alumina substrate and dried at 95°-100° C. A patterning paste containing 7 g alumina, 3.5 g Tergitol ® TMN-6, 3.15 g of terpineol isomers and 0.35 g ethyl cellulose was screen printed onto the dried dielectric paste layers and heated at 95°-100° C. to dry the overprinted paste and to effect diffusion of the Tergitol detergent into the underlying dielectric layer. When the dried layer was washed under tap water, six mil vias were clearly resolved. In subsequent tests, it was shown that the use of additional plasticizer in the underlying polymer layer improved resolution still further.

Example 10

In the following examples two dielectric pastes were prepared and each was used to prepare a series of patterning systems on alumina substrates using the same patterning paste. The composition of the three dielectric pastes differed in that dielectric paste B contained buytl benzal phthlate and dielectric paste A contained more volatile dip phthlate plasticizer.

The composition of dielectric paste A was the same as Example 7 above and the composition of dielectric paste B was identical except that dipropyl phthalate, a more volatile plasticizer, was used in place of dibutyl benzol phthalate. The composition of the patterning paste was the same as Example 7, except that it contained no pt acetylacetonate.

Both of the dielectric pastes were printed with screen opening of 6-11 mils and then dried at 80°-85° C. for 12 minutes. The patterning paste was then printed over the dried dielectric layers and heated to 95°-100° C. for 10 minutes to dry the layer and to effect diffusion of the plasticizers into the underlined dielectric layers. The assemblages were then developed for 10-15 seconds in a chlorothene spray after which they were rinsed with water and dried with an air knife. Upon measurement of the vias produced in each assemblage, it was shown that the vias from the dielectric layers containing the more volatile plasticizer were uniformly closer in size to the opening of the printing screens used for applying the patterning layer.

TABLE 4

Effect of Plasticizer Volatility and Screen Size on Via Definition

| Patterning Screen size mils | 5.5 | 6.0 | 6.5 | 7.0 | 11.0 |
|---|---|---|---|---|---|
| Via size | | | | | |
| Dielectric Paste A | 5.5 | 6.5 | 6.0 | 7.5 | 12.0 |
| Dielectric Paste B | 6.5 | 8.0 | 7.5 | 9.0 | 12.5 |

Glossary

| | |
|---|---|
| Carbitol | Trademark of Union Carbide Corportion, Danbury, CT for diethylene glycol ethyl ethers. |
| Carboset | Trademark of B. F. Goodrich & Co., Cleveland, OH for acidic methylmethacrylate copolymers. |
| Elvacite 2010 | Trademark of E. I. du Pont de Nemours and Co., Wilmington, DE for methyl methacrylate resins. |
| Freon MF and TF | Trademarks of E. I. du Pont de Nemours and Co., Wilmington, DE for trichlorofluoromethane and trichlorofluoroethane respectively. |
| Ionol | Trademark of Shell Chemical Co., Houston, TX for hindered phenol antioxidants. |
| Santicizer | Trademark of Monsanto Chemical Co., St. Louis, MO for N-alkyl-para-toluenesulfonamide plasticizers. |
| T-200 | Trademark of Hercules, Inc., Wilmington, DE for ethyl cellulose. |
| Tergitol | Trademark of Union Carbide Corp., New York, NY for non-ionic surfactants. |

I claim:

1. A non-photographic method for making patterns in organic polymer films comprising the sequential steps:
   a. Applying to a substrate an unpatterned first layer comprising a solid organic polymer which is dispersible in a predetermined eluant;
   b. Applying to the unpatterned first layer a patterned second layer comprising an agent which is capable of changing the dispersibility of the solid organic polymer in the predetermined eluant;
   c. Effecting patterned diffusion of the dispersibility-changing agent into the underlying solid organic polymer layer; and
   d. Removing the areas of the underlying first layer which are dispersible in the eluant, by washing them with the predetermined eluant.

2. A negative-acting non-photographic method for making patterns in organic polymer films comprising the sequential steps:
   a. Applying to a substrate an unpatterned first solid organic polymer layer comprising a solid organic polymer;
   b. Applying to the unpatterned first organic solid polymer layer a patterned second layer comprising a viscous dispersion of solid organic polymer, dispersibility-changing agents optionally a solvent, the dispersibility-changing agents (1) being a dispersant for the polymer of the first organic polymer layer and (2) having a higher atmospheric boiling point than the solvent;
   c. Drying the patterned second layer to remove the solvent therefrom and to effect patterned diffusion of the solubilizing agent into the underlying first organic polymer layer; and
   d. Removing the patterned second layer and the diffusion patterned areas of the underlying first layer by washing them in a an eluant in which the second layer and diffusion-patterned areas of the first layer are dispersible.

3. A positive-acting non-photographic method for making patterns in organic polymer films comprising the sequential steps:
   a. Applying to a substrate an unpatterned first layer comprising a solid organic polymer which is dispersible in a predetermined solvent;
   b. Applying to the unpatterned first layer a patterned second layer comprising a desolubilizing agent which is capable of decreasing the solubility of the organic polymer in the solvent;
   c. Heating the patterned second layer to effect patterned diffusion of the desolubilizing agent into the underlying first organic polymer layer and to render the diffusion patterned areas of the polymer in the first layer insoluble in the solvent; and
   d. Removing the non-patterned areas of the underlying first layer by washing them in the predetermined solvent.

4. The method of claim 1 in which the dispersibility-changing agent is a catalyst for decomposition of the first layer polymer.

5. The method of claim 1 in which the dispersibility-changing agent is a plasticizer for the first layer polymer.

6. The method of claim 1 in which the dispersibility-changing agent is a detergent capable of dispersing the first layer polymer.

7. A non-photographic method for making patterns in organic polymer films comprising the sequential steps:
   a. Applying to a substrate an unpatterned first layer comprising a solid organic polymer which is soluble in a predetermined solvent;
   b. Applying to the unpatterned first layer a patterned second layer comprising an agent which is capable of changing the solubility of the solid organic polymer in the predetermined solvent;
   c. Effecting patterned diffusion of the solubility-changing agent into the underlying solid organic polymer layer; and d. Removing the areas of the underlying first layer which are soluble in the solvent, by washing them with the predetermined solvent.

8. A negative-acting non-photographic method for making patterns in organic polymer films comprising the sequential steps:
   a. Applying to a substrate an unpatterned first solid organic polymer layer comprising a solid organic polymer;
   b. Applying to the unpatterned first organic solid polymer layer a patterned second layer comprising a viscous solution of solid organic polymer, solubilizing agent and solvent, the solubilizing agent (1) being soluble in the polymer of the first organic polymer layer and (2) having a higher atmospheric boiling point than the solvent;
   c. Drying the patterned second layer to remove the solvent therefrom and to effect patterned diffusion of the solubilizing agent into the underlying first organic polymer layer; and
   d. Removing the patterned second layer and the diffusion patterned areas of the underlying first layer by washing them in a second solvent in which the second layer and diffusion-patterned areas of the first layer are soluble.

9. A positive-acting non-photographic method for making patterns in organic polymer films comprising the sequential steps:
   a. Applying to a substrate an unpatterned first layer comprising a solid organic polymer which is soluble in a predetermined solvent;
   b. Applying to the unpatterned first layer a patterned second layer comprising a desolubilizing agent which is capable of decreasing the solubility of the organic polymer in the solvent;
   c. Heating the patterned second layer to effect patterned diffusion of the desolubilizing agent into the underlying first organic polymer layer and to render the diffusion patterned areas of the polymer in the first layer insoluble in the solvent; and
   d. Removing the non-patterned areas of the underlying first layer by washing them in the predetermined solvent.

10. A non-photographic method for making patterns in thick film layers comprising the sequential steps of:
    a. Applying to a substrate an unpatterned thick film layer comprising finely divided particles of electrically functional solids dispersed in an organic medium comprising a first solid polymer dissolved in a volatile solvent;
    b. Removing the solvent from the thick film layer by evaporation;
    c. Applying to the solvent-free unpatterned thick film layer a patterned second layer comprising a viscous dispersion of non-crystalline polymer, plasticizer for the first polymer and a second solvent, the plasticizer being soluble in the first layer polymer and having a higher boiling point than the second solvent;
    d. Heating the patterned second layer simultaneously to remove the second solvent therefrom by evaporation and to effect patterned diffusion of the plasticizer from the second layer into the underlying areas of the first layer;
    e. Washing the layers with a solvent in which both the plasticized first polymer and the second layer polymer are soluble to effect simultaneously removal of the patterned second layer and the underlying diffusion patterned areas of the first layer.

11. The method of claim 10 in which the first layer polymer and the patterned layer polymers are of the same composition.

12. The method of claim 10 in which the first layer polymer is poly (methacrylate), the plasticizer is an alkyl phthalate and the volatile solvent in the patterned layer is terpineol.

* * * * *

UNITED STATES PATENT AND TRADEMARK OFFICE
CERTIFICATE OF CORRECTION

PATENT NO. : 5,032,216

DATED : July 16, 1991

INVENTOR(S) : John J. Felten

It is certified that error appears in the above-identified patent and that said Letters Patent is hereby corrected as shown below:

Columns 17 and 18,
line 7, delete "Dibutyl" under the Patterning Solvent heading and insert -- Dibutyl Phthalate -- under the Desolubilizer (Positive) heading;

line 8, delete "Phthalate"; delete "Methyl Chloroform" under the Solubilizer (Negative) heading and insert -- Methyl Chloroform -- under the Patterning Solvent heading;

line 9, replace "Polymethylacrylate" with -- Polyethylacrylate --.

Signed and Sealed this

Eighth Day of June, 1993

Attest:

MICHAEL K. KIRK

Attesting Officer

Acting Commissioner of Patents and Trademarks